(12) United States Patent
Newberry

(10) Patent No.: US 10,907,656 B2
(45) Date of Patent: Feb. 2, 2021

(54) SILENT AIRFLOW GENERATION EQUIPMENT

(71) Applicant: Richard Down Newberry, Tuckahoe, NY (US)

(72) Inventor: Richard Down Newberry, Tuckahoe, NY (US)

( * ) Notice: Subject to any disclaimer, the term of this patent is extended or adjusted under 35 U.S.C. 154(b) by 111 days.

(21) Appl. No.: 15/888,053

(22) Filed: Feb. 4, 2018

(65) Prior Publication Data
US 2019/0242409 A1 Aug. 8, 2019

(51) Int. Cl.
| | |
|---|---|
| F04F 99/00 | (2009.01) |
| H01T 23/00 | (2006.01) |
| F03H 1/00 | (2006.01) |
| F04F 5/16 | (2006.01) |
| F04D 25/08 | (2006.01) |
| H02M 3/335 | (2006.01) |

(52) U.S. Cl.
CPC ........... *F04F 99/00* (2013.01); *F03H 1/0037* (2013.01); *F04D 25/08* (2013.01); *F04F 5/16* (2013.01); *H01T 23/00* (2013.01); *H01L 2924/0002* (2013.01); *H02M 3/335* (2013.01)

(58) Field of Classification Search
CPC F04F 99/00; F04F 5/16; F03H 1/0037; H01T 23/00; H02M 3/335
See application file for complete search history.

(56) References Cited

U.S. PATENT DOCUMENTS

| | | | | |
|---|---|---|---|---|
| 6,484,502 | B1* | 11/2002 | Kikuchi | F02C 3/00 60/648 |
| 7,054,130 | B2* | 5/2006 | Gorczyca | H01T 23/00 361/230 |
| 7,545,640 | B2* | 6/2009 | Fisher | F28F 13/16 29/592.1 |
| 7,911,146 | B2* | 3/2011 | Dunn-Rankin | H01T 23/00 315/111.81 |
| 8,008,617 | B1* | 8/2011 | Berends, Jr. | H01J 49/0422 250/282 |
| 8,625,252 | B2* | 1/2014 | Kitagaito | A61L 9/22 361/230 |
| 2002/0050719 | A1* | 5/2002 | Caddell | F02K 7/12 290/54 |
| 2003/0189169 | A1* | 10/2003 | Wells | H01J 49/04 250/288 |

(Continued)

*Primary Examiner* — Michael C Zarroli
(74) *Attorney, Agent, or Firm* — Richard Down Newberry

(57) ABSTRACT

A blower/fan for the purpose of greatly reducing noise levels and extending longevity over conventional blade-based blower/fans (e.g., 50 decibel leaf-blower), due to having a totally novel absence of moving parts, such as motor and blades, which create most of the noise and wear out faster. The air motivating force comes from an electrohydrodynamic ionic wind created by a very strong electric field crossing two uniquely configured electrodes. This wind is then further amplified by inducing outside air to be added to this wind by means of a Coandă surface at the entrance to the wind tunnel and which then feeds over a slit. A diffuser section follows causing the wind pressure to build for improving the exiting air characteristics. The novel diffuser and Coandă surfaces will have reduced drag and noise due to both a low friction surface coating and a dimpled surface like a golf ball so as to further reduce drag.

13 Claims, 2 Drawing Sheets

(56) References Cited

U.S. PATENT DOCUMENTS

| | | | | |
|---|---|---|---|---|
| 2003/0201646 A1* | 10/2003 | Kaploun | ................ | H02K 7/183 290/54 |
| 2009/0050801 A1* | 2/2009 | Fedorov | ................ | H01J 49/066 250/288 |
| 2012/0300356 A1* | 11/2012 | Katano | .................. | H01T 23/00 361/231 |

* cited by examiner

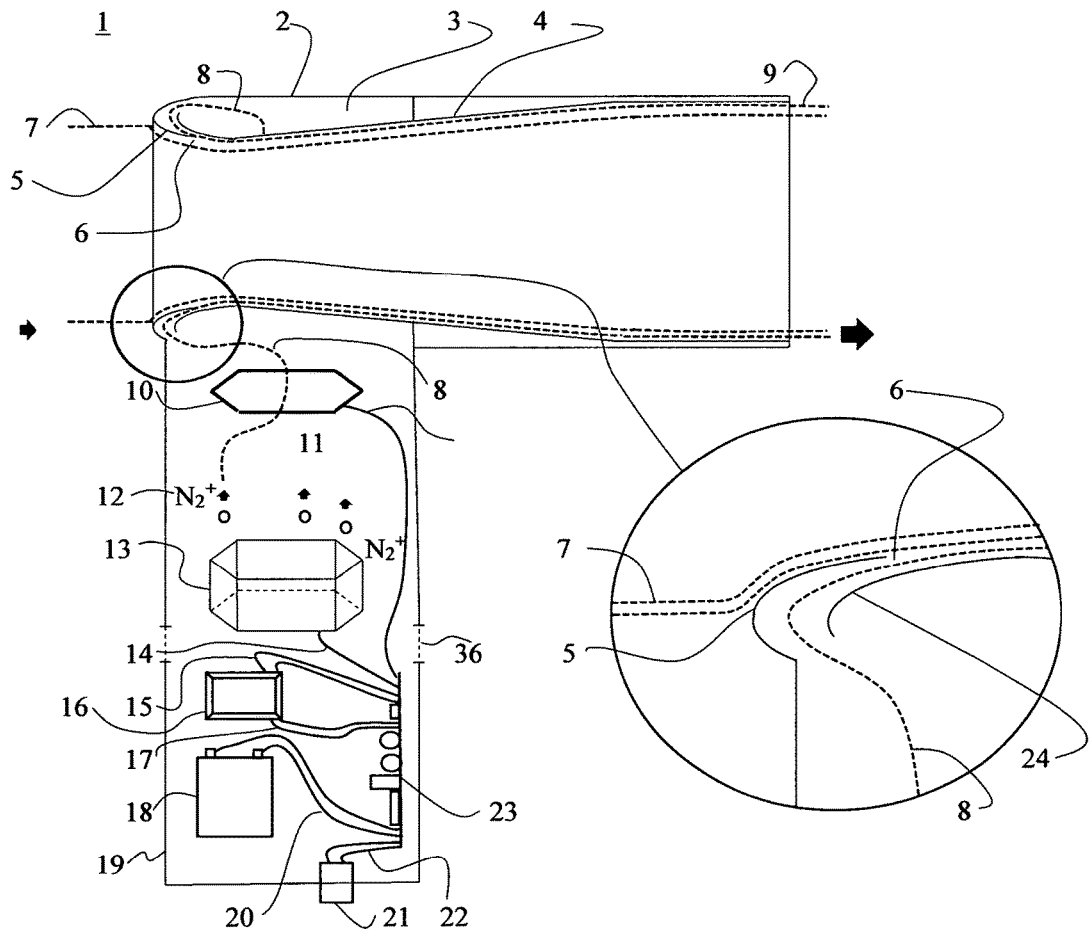
FIG. 1   SILENT AIRFLOW GENERATION EQUIPMENT

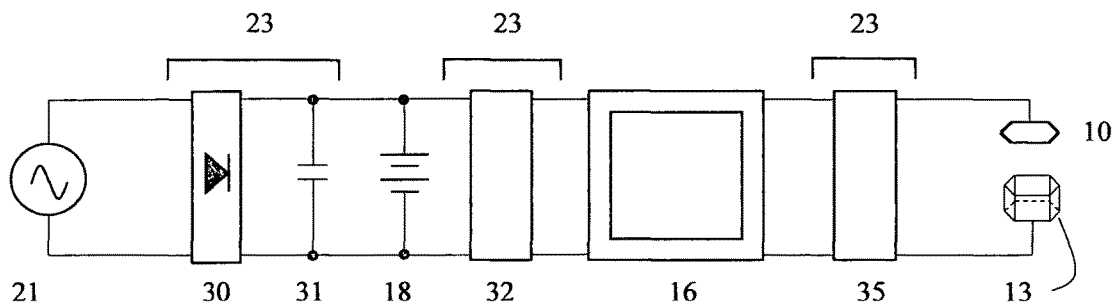
FIG. 2 ELECRICAL SYSTEM
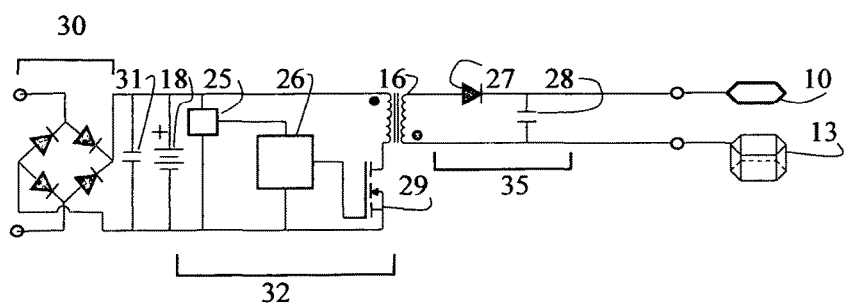
FIG. 3 PREFERRED ELECTRICAL SECTION DETAILS
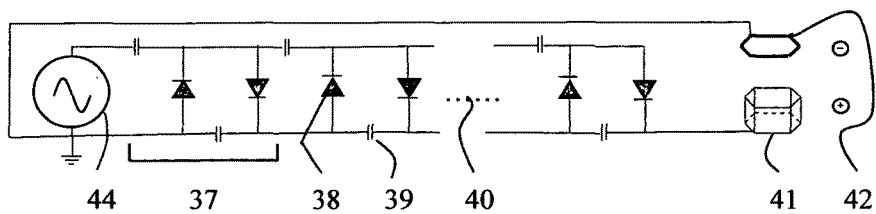
FIG. 4 VOLTAGE MULTIPLIER DETAILS

US 10,907,656 B2

SILENT AIRFLOW GENERATION EQUIPMENT

BACKGROUND OF THE INVENTION

Effective means of quietly powering air transport or surveillance vehicles, manned and unmanned, or for high volume blower applications such as leaf blowers or for general fan applications where low noise is desired have long been in demand. Leaf blowers disturb the peace in neighborhoods every fall and vacuum cleaners are irritatingly noisy, drones are easily detected by noise, fans in a child's bedroom may keep them cool but often awake and planes near airports disturb homes. Additionally, motor and blade designs inherently cause some vibration which contributes to the noise as well as to vibration of cameras in drones. Efficiencies of these devices are typically low, as well, due to turbulence in the fan blade or turbofan, internal surface's air drag and motor or fuel to propulsion conversion inefficiencies. Attempts to quiet current technologies have added cost with marginal success at best.

SUMMARY OF THE INVENTION

The principle anticipated applications of this Silent Airflow Generation Equipment (SAGE) invention are wherever air movement is needed, from low velocity fans to high flow rate propulsion. These applications include, but are not limited to fans, blowers, aircraft lift and direction propulsion, hovercraft, vacuum cleaners and inflation devices. Improvements to current technologies include much higher efficiency, far lower noise and virtually no moving parts for much greater durability.

The essence of the design includes electrical ionic wind generation, mechanical form flow amplification, discharge tube surface treatment so as to minimize drag and a flow rate sensor-based feedback to an adjustable switch mode power supply (SMPS) control circuit.

The ionic wind generator consists of two electrodes spaced far apart such that when a high voltage is applied, arcing does not occur, but generation of ions does occur. These ions are attracted to the other electrode and hit air molecules in their travels toward said electrode. Momentum of the ions is partially transferred to said air molecules and the ionic wind builds up to the point of reaching the opposite electrode.

The flow is amplified by having the ionic wind flow out of its generation area, through a circular slot and into the discharge tube. As it does so, it is flowing at a moderate speed which creates a low pressure by means of the Bernoulli Effect. This low pressure pulls additional outside air in through the inlet of the discharge tube. Before it reaches the escaping ionic wind it flows over a uniquely shaped surface which allows the Coandă Effect to force the air flow to hug said surface and, thus, cause a turbulence-free laminar flow which adds to the ejecting ionic wind flow. Such flow is quieter than turbulent flow, as well as being more efficient, since the energy remains in pushing the airflow rather than some of this energy being converted to heat and sound from the turbulence. Being a laminar flow at exiting, the air will be more cohesive and stay more focused.

Drag is caused by friction between the air flow and the discharge tube surface. It is also caused by turbulence at the fan blade's trailing edge. This is minimized here by three means; use of a low friction surface coating and a 'dimpling' of the surface, similar to a golf ball and the lack of blade usage. Overall drag is reduced by dimpling by ways of a small amount of turbulence in the dimples causing the air flow to hug the surface some distance around the tailing end of the curved surface and thereby separating from the surface later than from an undimpled surface, reducing drag. For example, a golf ball typically travels about twice as far with dimples added.

The rate of air flow is controlled by a sensor sending feedback to the control circuit. Said circuit then adjusts the output of the switch mode power supply (SMPS) so as to maintain the air flow rate. If the application has means for the user to set different air flow rates, said air flow control will adjust the SMPS accordingly.

The airflow function requires no moving parts. However, some applications that have additional functions may need moving parts (e.g., a house fan that provides a sweeping back and forth feature). Also, some applications (e.g., helicopters) generate counterrotation forces that must be counteracted. This is not an issue with this SAGE devise, as no rotating parts are used.

BRIEF DESCRIPTION OF THE SEVERAL VIEWS OF THE DRAWINGS

FIG. 1 shows the complete Silent Airflow Generation Equipment system 1, exposing the contents of the ionic wind generator containment enclosure 19 of control board 23, optional battery 18, transformer electrode 13, transformer electrode 10, intake vent 36, Coandă intake form 5, ionic wind compression chamber 3, diffuser cone 4, low drag surfaces 24, 4 & 37, wind tube 2, interface power socket 21, transformer 16, ionic wind exit slit 6, cables from transformer to electrodes 11 & 14 and exit tube 37.

FIG. 2 shows the basic design of the ionic wind amplifier comprising power socket 21, control board 23, optional battery 18, transformer 16, and electrodes 10 and 13 of FIG. 1.

FIG. 3 shows the preferred circuit schematic, comprising full-wave rectifier 30, capacitor 31, battery 18, switch-mode power supply driver 32, transformer 16, output filter and rectifier 35, and electrodes 10 and 13 of FIG. 2. Full-wave rectifier 30 is comprised of four rectifying diodes, circuit 32 consists of is a voltage regulator 25, a control chip 26 for transistor 29 and circuit 35 consists of a rectifier 27 and filter capacitor 28.

FIG. 4 shows the optional voltage multiplier schematic, comprising an alternating current input from FIG. 3, transformer 16 output, a core voltage doubler sub-circuit 37, rectifiers 38, capacitors 39, numerous additional voltage doubler sections 40, ion generating electrode 41 and receiving electrode 42.

DETAILED DESCRIPTION OF THE INVENTION

The key focus of this invention is to provide practical means to greatly reduce the noise from fans, blowers, vacuum devices and propulsion/lift fans in aircraft. Most all such applications use blades turned by electric motors or fuel engines. All are too noisy, by most people's standards. Blades, motors and air drag are the source of most of this noise. This SAGE fan has no moving parts, controls the air movement with minimal turbulence, greatly reduces noise and does so more efficiently. Here's how it does it:

Rather than move the air by pushing it with rotating fan blades or by burning fuel in an engine that turns said blades, the SAGE 'fan' uses an electric field to create ions that move towards the opposite electrode then strike air molecules that move forward as an ionic wind. This airflow rate is amplified by increasing the wind flow rate through a slit which induces additional outside air by an air pressure differential (Bernoulli Effect). This outside air flows in over a Coandă surface to create nonturbulent airflow (Coandă Effect). The wind is then moved through a diffuser tube to adjust the wind speed and pressure.

Referring to FIG. 1, power either from a battery 18 or an AC line cord/jack 21 into an AC to DC converter FIG. 2, 30+31 is connected to a switch mode power supply driver 32. The driver then drives a high frequency/high voltage transformer 16 whose output is rectified FIG. 2, 35 & FIG. 3, 27 and filtered FIG. 3, 28 to create a high frequency/high voltage waveform to have a high voltage DC output. FIG. 3 shows the preferred embodiment of FIG. 2. AC to DC is done using a full wave rectifier 30 which is filtered by capacitor 31 and charges optional battery 18. Switch mode power supply driver 32, consisting of voltage regulator 25 and MOS transistor control IC 26 which drives said transistor 29, switches current on and off in the primary of transformer 16 causing high voltage spikes from the secondary coil. Said spikes charge output capacitor 28 through rectifier 27. FIG. 4 shows the voltage multiplier circuit which accepts AC power from FIG. 3, transformer 16 output in from the switch mode power supply FIG. 3, 32, then feeding into the rectifier/capacitor 35, as an alternative way to obtain the higher output voltage requirements of some applications.

The output of the AC to offset AC convertor then is fed to the electrodes 10 & 13. The ionic wind is then generated across the gap between said electrodes by ionized air being attracted to the opposite electrode. Thus, an ionic wind.

This ionic wind 8 then enters the compression cavity 3 followed by exiting through the ring slot 6 at high velocity. This highspeed wind creates a large pressure differential (per the Bernoulli Effect) which induces outside air 7 at the wind tube 2 entrance where the Coandă surface 5 is located. Thus, the induced air travels over said surface and becomes laminar flow that hugs said surface. This induced wind then combines with the slit exiting ionic wind. The combined winds then enter the diffuser tube 4 which expands the airflow which increases the pressure while reducing the velocity and exits 9. This diffuser section is dimpled like a golf ball to minimize drag and further drag reduction is done by a very low friction coating such as PTFE (polytetrafluoroethylene).

An example of an implementation of this invention is as follows. The blower tube 2 is six inches in diameter and 1.5 feet long. The ring slot 6 is 0.0625″ wide. The lower electrode 13 is 4 inches wide, flat to flat and 2 inches deep with 18-gauge aluminum sheets (0.0403 inch thick). The upper electrode 10 is 0.125-inch diameter aluminum rod and 4 inches wide, flat to flat. They are separated by 5 inches. The DC voltage applied is 80 kilovolts and the DC ionic current flow is 8 mA. The airflow exiting the blower is approximately 310 CFMs (cubic ft./minute).

The key improvement features include;
1. Very quiet operation compared to current devices which are often very intrusively noisy (e.g., leaf blowers are typically 70 dBA at 50 feet, whereas normal conversation is about 50 dBA at 5 feet; about one hundredth the loudness. A similar leaf blower using this invention is about 60 dBA at 50 feet, which is one tenth the loudness) and more collinear, direction focused airflow output.
2. The quiet operation allows surveillance drones to be much less often noticed.
3. No moving parts which translates to minimal maintenance.
4. With no moving parts, malfunctions are rare, and a long life is assured.
5. High energy efficiency which means longer use time on a battery charge.
6. Safer than gasoline powered devices which have fire potential and require gasoline cans to be stored in a safe place.
7. Cleaner than fuel powered devices since they have no messy oil/fuel mixing to do.
8. Lower cost fueling.

What is claimed is:
1. An air movement device, typically a fan or blower, that operates at sound pressure levels well below known currently marketed fan/blower applications:
   with one preferred embodiment, a leaf blower about 90% quieter at 50 feet, 70 dBA vs 60 dBA,
   the principle of this invention is the combination of an ionic wind generator with a Coandă effect tube to increase the mass flow rate,
   the use of golf ball-like dimples with very low friction to coat air tube to minimize drag of the airflow, and
   along with the drag reduction effect (about 10% less drag) of ionized air (plasma, whose charge causes the flow to hug the blower tube walls for laminar flow), which also causes releasing the ionized air flow to the environment in a more collinear fashion for a more focused beam of air with slower transition into airflow diffusion and the use of over 90% efficient electronics for extended battery life by virtue of construction having:
   a) An ionic wind generator that uses either
      (i) a battery DC power source or
      (ii) an AC line voltage power source rectified and R/C filtered to create a DC power source that is then fed into a switch mode power supply convertor that drives either,
         (I) a high frequency and high voltage transformer only or add a second stage of;
         (II) a classic diode/capacitor voltage multiplier for over 30% more output CFM;
   b) the ionic wind generator applies said voltage (usually about 70 KV) output through an AC to DC rectifier/capacitor circuit to provide only DC voltage into two electrodes which causes the ionization of nitrogen on an upstream wind electrode that is a large cylindrical metal polygon or round shape and thereby causing the ionized nitrogen to be pulled through an electric field to a receiving electrode that is a matching polygon or round shaped metal ring and
      creating said ionic wind which then is channeled through a narrow, ring shaped slot at a high speed which creates a pressure differential with the surrounding outside air, which in turn causes outside air to be drawn into the ionic wind stream, thus amplifying the airflow, and
      as said outside air flows in, it passes over an inlet lip shaped to cause said flow to hug said lip, by the Coandă Effect, in a laminar flow which then, combined with the ionic wind, flows down the outlet tube over the golf ball-like dimpled surface that is low friction coated, to provide very low drag combined with an added 15% drag reduction from the ionized nitrogen plasma effect then, out through a diffuser of the final device section, the wind discharge tube, to balance the speed to pressure ratio, then
out of the tube, in a laminar flow which focuses the air for a longer range, higher flow rate and higher pressure and
c) said high voltage and high frequency transformer (typically 70 KV and 50 KHz)_using preferably a high frequency ferrite core with primary and secondary windings that are encased in a vacuum impregnated potting material, preferably an epoxy, and
d) two electrodes connected to the rectified output of said transformer with one being a loop of heavy wire or tubing in any of a variety of possible shapes from round to a multisided polygon and the other electrode being a short cylinder of sheet metal formed in a round or polygon shape matching the first electrode in shape and width, and whose wall sections are all parallel to the direction of ionic wind flow.

2. A fan design as in claim 1, in which the final tube discharging the ionized air, from a Coandă surface intake to the point of discharge, is coated with a low friction material, preferably, like PTFE (polytetrafluoroethylene), and has dimpling, similar to a golf ball, across its entire surface so as to minimize turbulence, and thus drag, and creates a more collinear beam of airflow for better focusing with additional drag reduction (about 15%) from the plasma co-linearization effect.

3. A fan design as in claim 1, in said switch mode power supply optionally feeds a series of rectifying diodes and capacitors arranged in a traditional voltage multiplier fashion to produce a 30 to 45% higher voltage for higher CFMs.

4. A fan design as in claim 3, in which the power is a battery, in place of the rectified AC line voltage, that feeds into said switch mode power supply.

5. A fan design such as claim 1, in which the power supply is a line voltage cord whose voltage is converted to a DC voltage.

6. A fan design as in claim 1, in which the fan is used as a leaf blower.

7. A fan design as in claim 1, in which the fan is used as propulsion for an aircraft.

8. A fan design as in claim 1, in which the fan is used as propulsion for a drone.

9. A fan design as in claim 1, in which the fan is used as propulsion for a hovercraft.

10. A fan design as in claim 1, in which the fan is used as a general-purpose fan.

11. A fan design as in claim 1, in which the fan is used as a space ventilation fan.

12. A fan design as in claim 1, in which the fan is used as a road vehicle propulsion fan or
one or both of horizontal propulsion or vertical levitation.

13. A fan design as in claim 1, in which the fan is designed with a circular blower tube, an
ionic wind discharge slit preferably with less than 0.2" wide gap, preferably a switch mode power supply that drives a high frequency and high voltage transformer and output electrodes preferably spaced 3" to 10" apart, depending on the airflow rate.

* * * * *